United States Patent [19]

Ignatowski

[11] Patent Number: 4,803,422

[45] Date of Patent: Feb. 7, 1988

[54] ELECTRICAL MONITORING OF FLIP-CHIP HYBRIDIZATION

[75] Inventor: John J. Ignatowski, Warren, Mich.

[73] Assignee: General Dynamics, Pomona Division, Pomona, Calif.

[21] Appl. No.: 138,161

[22] Filed: Dec. 28, 1987

[51] Int. Cl.⁴ .................. G01R 31/28; H01L 21/66
[52] U.S. Cl. ..................... 324/73 R; 324/158 D; 324/158 R; 324/537; 437/8
[58] Field of Search .......... 324/73 R, 73 PC, 158 D, 324/158 R, 501, 537; 358/10, 139; 437/8; 136/290; 365/112

[56] References Cited

U.S. PATENT DOCUMENTS

| | | | |
|---|---|---|---|
| 2,465,355 | 3/1949 | Cook | 324/121 X |
| 2,535,043 | 12/1950 | Cook | 324/121 X |
| 2,878,450 | 3/1959 | Rabier | 324/121 |
| 3,115,605 | 12/1963 | Coulter | 324/121 X |
| 3,179,883 | 4/1965 | Farrow | 324/121 |
| 3,398,363 | 8/1968 | Mortley | 324/121 |
| 3,523,246 | 8/1970 | Hall et al. | 324/121 X |
| 4,257,043 | 3/1981 | Tsuchiko | 324/121 X |
| 4,417,203 | 11/1983 | Pfeiffer et al. | 324/537 |
| 4,633,175 | 12/1986 | Ritchie et al. | 324/158 R |

Primary Examiner—Ernest F. Karlsen
Attorney, Agent, or Firm—Angus C. Fox, III

[57] ABSTRACT

An array of photosensors is electrically connected to an array of individually readable capacitive storage cells in a one-to-one correspondence, each photosensor and each storage cell having a parasitic resistance. The interconnection is performed in an environment which is adapted to minimize photon impingement upon said photosensors cells and thereby minimize photocurrent. Each connection, if successfully made, places the parasitic resistance of a photosensor in electrical parallelism with the parasitic resistance of its corresponding capacitive storage cell. The continuity of each of the electrical interconnections is monitored by precharging the storage cells to a known potential difference, after a suitable period of time reading the potential differences across each storage cell to obtain a set of analog signals representing the magnitude of the potential differences remaining across the storage cell, obtaining a digital signal representation of the magnitude of each of said analog signals, and displaying the digital signals in analog form in an ordered pattern of indicia on a variable intensity screen such that each digital signal is represented by a uniquely positioned indicium, the intensity of each of said indicia being inversely proportional to the magnitude of the potential difference represented by the indicium's associated digital signal.

10 Claims, 2 Drawing Sheets

ELECTRICAL MONITORING OF FLIP-CHIP HYBRIDIZATION

BACKGROUND OF THE INVENTION

This invention relates in general to means and methods of checking the integrity of individual electrical connections between an array of photosensors adapted to produce an electric current in response to photon impingement thereon and a corresponding array of capacitive storage cells, and in particular to hybrid devices in which two such arrays are intended to be electrically connected by flip-chip bonding processes, each of said storage cells having an effective parasitic resistance of much greater magnitude than its corresponding photosensor.

Flip-chip hybrid bonding is a vertical interconnect process for mating two or more microelectronic chips. Electrical connections are made by means of conductive solder bumps or bonding points between the chips. In the process, a first chip with an array of solder, or other bonding medium, bumps formed thereon is flipped over (flip-chip), aligned to, and pressed onto a corresponding array of bonding pads or bumps on the second chip. The compression mates the solder bumps to the bonding pads establishing both mechanical and electrical connections between the two chips.

A major problem with this technology is the monitoring of the typically large number of bump/bonding pad interconnects which are formed. The interconnects can number in the thousands. Typically, the solder bumps are not all of exactly the same height so different bumps will bridge the gap between the two chips at different times during the hybridization. If there is insufficient compression, then the shorter bumps will not make contact with their associated bonding pads, thus leaving an open circuit when a closed circuit was intended. If there is too much compression, then the taller bumps may become so deformed that they expand laterally and short to their nearest neighbors.

Normal visual inspection methods are an impractical means of monitoring the interconnects because of their number and because most of the interconnects are hidden from view by their surrounding neighbors. The conventional process for checking the interconnect status is to stop the hybridization, mount the device, bring it to its operating temperature, and run it. If a good electrical connection has been made between the two chips, then the circuit associated with each interconnect will respond properly. If additional compression is required, the device must be reinserted into the hybrid aligner-bonder, realigned, recompressed and retested until the required number of interconnects are properly made.

This invention provides a means of obtaining an immediate feedback as to the status of all of the bump/bonding pad interconnects. Such information is useful for determining how well the hybridization is proceeding as well as when it is complete. Early monitoring in hybridization provides important information on how well the alignment of the bumps and pads was performed. For example, if the two chips are not properly coplanarized, then one corner of the chips will undergo hybridization long before the opposing corner does. For hybrid devices which are normally operated at cryogenic temperatures, room temperature monitoring, as provided by this invention, also eliminates the time and need to cool the devices to their operating temperatures for intermediate testing. Finally, since the interconnects of the chips can be tested while the chips are still mounted in the hybridization chucks, the potential for damaging the chips by mounting and dismounting is minimized or altogether eliminated.

Other advantages and attributes of this invention will be discussed or will otherwise be readily discernible upon a reading of the text hereinafter.

SUMMARY OF THE INVENTION

An array of photon impingement responsive photosensors is mechanically and electrically connected to an array of individually addressable, capacitive storage cells in a one-to-one correspondence. The interconnection is performed in an environment which is adapted to minimize photon impingement upon said photosensors. The continuity of each of the electrical interconnections is monitored by sequentially addressing the storage cells at a predetermined rate to obtain a sequence of analog output signals, obtaining a digital signal representation of the magnitude of each of said analog output signals, and displaying the digital signals in analog form in an ordered pattern of indicia on a variable intensity screen such that each digital signal is represented by a uniquely positioned indicium, the intensity of each of said indicia being inversely proportional to the magnitude represented by its associated digital signal.

DESCRIPTION OF THE PREFERRED EMBODIMENT

Figure 1:
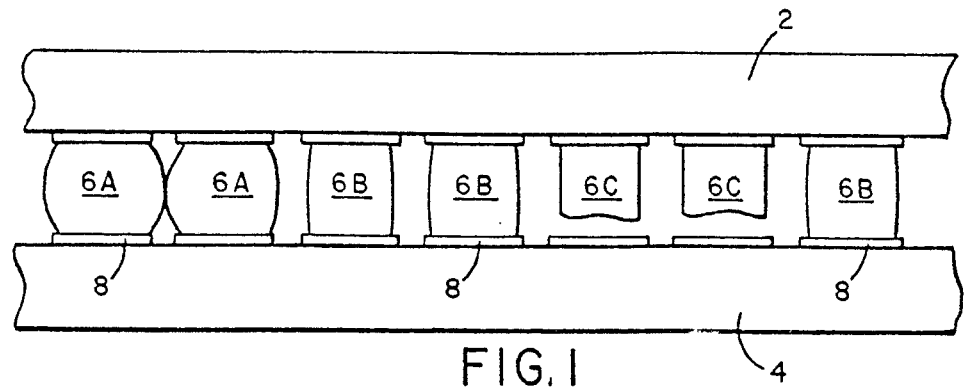
FIG. 1 is an enlarged partial view of interconnects between two chips which have undergone flip-chip hybrid bonding.

Referring to FIG. 1, an array 2 of photosensors is shown to be in the process of being flip-chip bonded to an array 4 of capacitive storage cells. The photosensors have bonding terminals which are bumps of conductive bonding medium, 6A–6C, and the capacitive storage cells have corresponding bonding terminals which are pads or bumps 8. In the flip-chip bonding process, one of the chips (in this case the photosensor array) is "flipped" such that its bonding terminals face and align with the bonding terminals of the other chip (in this case the capacitive storage cell array). The two chips are compressed together to cause bonding between the bonding medium and the pads, and thereby establish both mechanical and electrical connections between the chips.

FIG. 1 clearly shows the problems that can occur in such a process. The bumps of bonding medium are not all of uniform height so that some bumps will bridge the gap between the chips sooner than others during the compression process. If there is insufficient compression, then the shorter bumps 6C will make no contact with their corresponding pads 8 leaving an open circuit between them. If there is too much compression, then the taller bumps 6A may become so deformed that they short to their nearest neighbors. Ideally, a good mechanical and electrical connection is made as between the bumps 6B and the pads 8.

Figure 2:
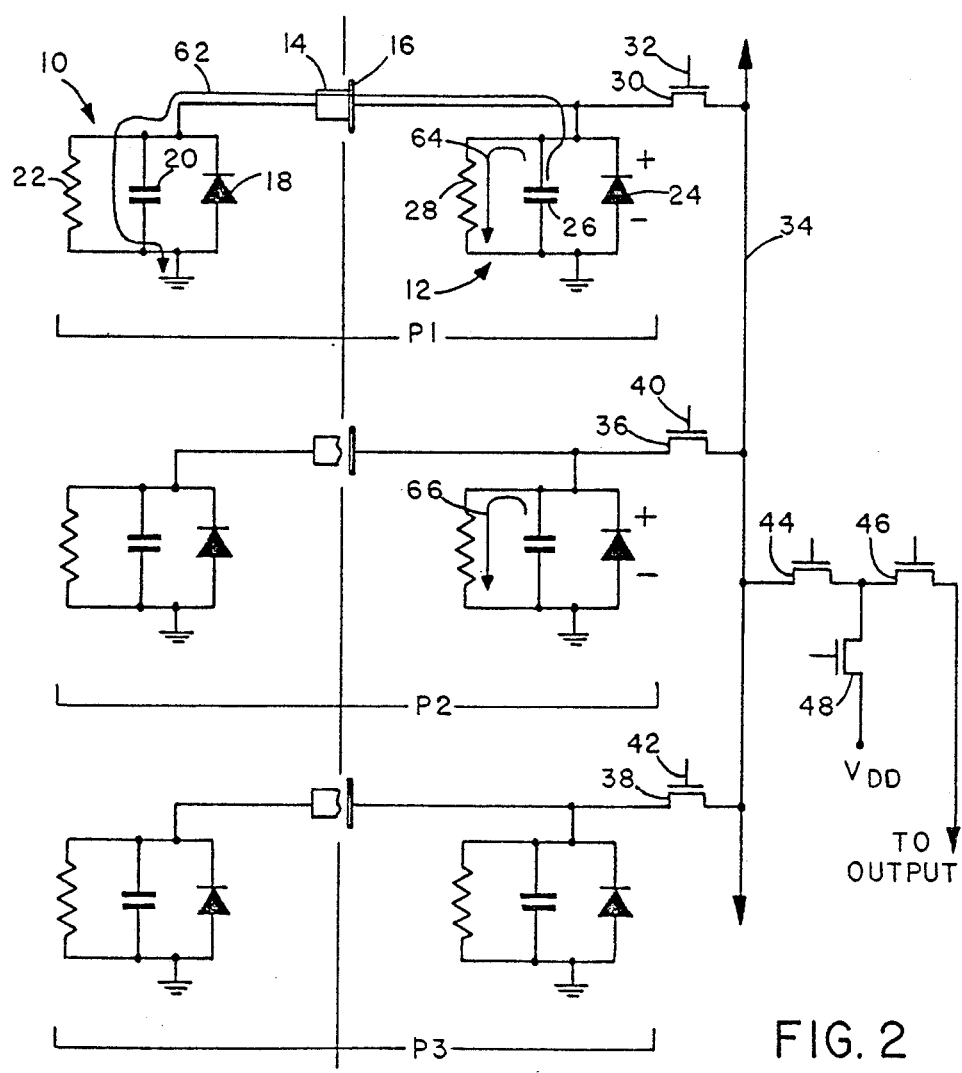
FIG. 2 is a schematic of three pixels after bonding.

Referring to FIG. 2 a first photosensor generally designated 10 and a first capacitive storage cell generally designated 12 is shown to be connected in electrical parallelism by a connection of a bump 14 and pad 16. The photosensor 10 is shown as a photodiode which can be characterized by an ideal diode 18 in parallel with a junction capacitance 20 in parallel with a parasitic resistance 22 on the order of $10^4$ ohms at room temperature. The capacitive storage cell 12 can be a semiconductor p/n junction, such as a diffusion of n+ material into a p substrate, and when the junction is reverse biased it can be characterized by an ideal diode 24 in parallel with a depletion region capacitance 26 in parallel with a parasitic resistance 28 on the order of $10^{10}$ ohms at room temperature. The parallel circuit of a photosensor and a storage cell can be referred to as a pixel, the parallel circuit of the first photosensor 10 and the first storage cell 12 being a first pixel generally designated P1.

It can be seen that the anodes of both the photosensor 10 and the capacitive storage cell 12 are electrically connected to a common ground reference, and the cathodes are electrically connected to a terminal of a first pixel gating means 30 which can be an isolated gate, field effect transistor such as a MOSFET. The other terminal of the first pixel gating means 30 is electrically connected to a bus line 34. The first pixel gating means 30 is operative to permit bidirectional electrical communication between the storage cell 12 and the bus line 34 in response to the presence of a gating signal 32, and to prevent such communication in the absence of the gating signal 32. Also electrically communicating with the bus line 34 via a second and third pixel gating means, 36 and 38, are a second pixel generally designated P2 and third pixel generally designated P3, respectively. The second and third pixel gating means are identical to the first pixel gating means 30, and are responsive to second and third gating signals, 40 and 42.

Referring again to FIG. 2, the bus line 34 is used to communicate the electrostatic levels of the pixels to an output via a buffer gate 44 and an output transfer gate 46, and is further used to communicate a reset voltage to the pixels via a reset gate 48 and the buffer gate 44. The gates and the signal line shown actually comprise a portion of a readout multiplexer by which the storage cells are collectively reset and individually read as to their electrostatic levels. An example of such a multiplexer is the CP2014 by Reticon.

In operation, reset of the storage cells is accomplished by opening all of the pixel gating means, buffer gates and the reset gate, thereby applying a voltage $V_{DD}$, less some voltage drops due to the gates, across all of the storage cells. Individual reading of a storage cell is accomplished by opening only the pixel gating means associated with the storage cell being read and the output transfer gate, thereby presenting the electrostatic level of the storage cell at the multiplexer output.

Figure 3:
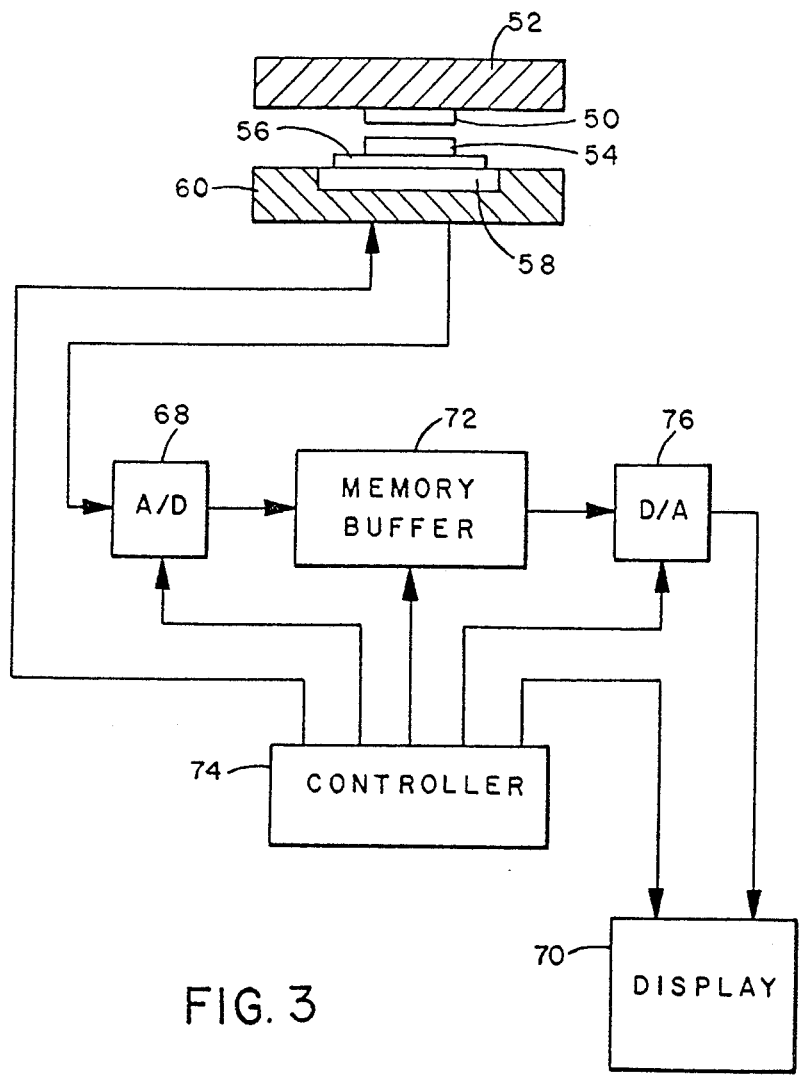
FIG. 3 is a section of a hybrid aligner-bonder and a functional block diagram of a circuit which is in electrical communication with a multiplexer mounted in a bottom chuck of said aligner-bonder.

Referring to FIG. 3, a photosensor element array chip 50 is mounted in a flipped position in a top chuck 52 of an hybrid aligner-bonder, and a multiplex chip 54 is mounted on a dual-in-line package 56 the leads of which are in electrical contact with a zero insertion force test socket 58. The socket 58 is part of the bottom chuck 60 of the hybrid aligner-bonder. In the hybridization process the chucks come together and compress the two chips in order to create the desired mechanical and electrical bonding between the photosensors and the capacitive storage cells To provide verification and monitoring of electrical continuity between the photosensors and their corresponding storage cells a method comprising the following steps can be taken: (1) performing the hybridization in the dark relative to the photosensors in order to minimize photocurrent, (2) electrostatically charging the storage cells to a known level, (3) waiting a period of time for some discharge of the storage cells, the period being sufficient for there to be distinguishable differences between the charge levels of storage cells unconnected to photosensors and the charge levels of storage cells connected to photosensors, but not long enough for a full discharge of a cell unconnected to a photosensor, (4) reading the electrostatic charge level of each storage cell, and (5) deriving from the reading an indication of the number of storage cells unconnected to photosensors. The term "dark" is relative to the characteristiss of the photosensors and refers to the general absence of photons of a wavelength or wavelengths to which the photsensors are responsive. The electrostatic charging of the storage cells can be accomplished by resetting the storage cells to a selected voltage as described above.

Referring again to FIG. 2, the signs (+ and −) next to the diode 24 of the first pixel storage cell 12 indicate the polarity of the electrostatic charge imposed on the pixel by a reset. It can be seen that the storage cell and photosensor diodes are reverse biased and therefore the charge is being held by the depletion region capacitances 26 and 20. Since a good connection has been made between the bump 14 and the pad 16, there are two paths by which the charge can bleed-off. One path shown by arrow 62 is through the photosensor's parasitic resistance 22, and the other path shown by arrow 64 is through the storage cell's parasitic resistance 28. The second pixel P2 does not show a good connection between its bump and its pad and therefore the only bleed-off path is through the storage cell's parasitic resistance as shown by arrow 66. Therefore the first pixel's storage cell will discharge at a significantly faster rate than will the second pixel's storage cell. The difference in the discharge rates will determine the length of the waiting period of step 3 of the method defined above. The waiting period must be long enough for the indicia representing storage cells not connected to their corresponding photosensors to be distinguishable by a monitoring person or machine from the indicia representing storage cells which were successfully connected to their corresponding photosensors.

Referring again to FIG. 3, step 5 of the above described method can be accomplished by obtaining a digital representation of the magnitude of each of the pixel's charge remaining after the waiting period by means of an analog to digital converter (A/D) 68 which receives as its analog input the pixel charge levels from the multiplexer, and displaying the digital representations in analog form in an ordered pattern of indicia on a variable intensity screen 70 such that each digital representation is represented by a uniquely positioned indicium, the intensity of each indicium being generally inversely proportional to the magnitude of the potential difference represented by the indicium's associated digital signal. As further steps, the digital representations from the A/D can be stored in a time buffering memory 72, and retrieved therefrom as needed by the screen, all under the control of a controller 74. The time buffering memory permits the digital representations to be stored therein without regard to the real time requirements of the display 70, and therefore eliminates the need to synchronize the charging and reading of the pixels with any real time requirement of the display 70, such as refresh cycles.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims.

I claim:

1. In a process of electrically connecting an array of photosensors to a one-to-one corresponding array of capacitive sensors, each photosensor having a parasitic resistance, each capacitive storage cell having a parasitic resistance which is generally an order of magnitude or more greater than the parasitic resistance of its corresponding the photosensor, each connection if successfully made placing the parasitic resistance of a photosensor in electrical parallelism with the parasitic resistance of said photosensor's corresponding storage cell, the storage cells being individually readable as to their electrostatic charge level, a method of monitoring the electrical continuity of the connections comprising the steps:
   (a) performing the connection process in the dark relative to the photosensors in order to minimize photocurrent,
   (b) electrostatically charging the storage cells to a known level,
   (c) waiting a period of time for some discharge ot the storage cells, the period being sufficient for there to be distinguishable differences between the charge levels of unconnected storage cells and the charge levels of connected storage cells, but not long enough for a full discharge of an unconnected storage cell,
   (d) reading the electrostatic charge level of each storage cell, and
   (e) deriving from the reading an indication of the number of unconnected storage cells.

2. The method of claim 1 further comprising the step of repeating steps (a) through (e) until the indicated number of unconnected storage cells is within a selected tolerance.

3. The method of claim 1 wherein step (e) comprises the steps:
   (e.1) obtaining a digital representation of the magnitude of each of the potential differences, and
   (e.2) displaying the digital representations in an analog form in an ordered pattern of indicia on a variable intensity screen such that each digital representation is represented by a uniquely positioned indicium, the intensity of each indicium being generally inversely proportional to the magnitude of the potential difference represented by the indicium's associated digital signal.

4. The method of claim 2 wherein step (e) comprises the
   (e.1) obtaining a digital representation of the magnitude of each of the potential differences, and
   (e.2) displaying the digital representations in analog for in an ordered pattern of indicia on a variable intensity screen such that each digital representation is represented by a uniquely positioned indicium, the intensity of each indicium being generally inversely proportional to the magnitude of the potential difference represented by the indicium's associated digital signal.

5. The method of claim 3 wherein the step (e.2) comprises:
   (e.2.1) storing the digital representations in a time buffering memory, and
   (e.2.1) retrieving the stored digital representations and displaying them in analog form in an ordered pattern of indicia on a variable intensity screen such that each digital representation is represented by a uniquely positioned indicium, the intensity of each indicium being generally inversely proportional to the magnitude of the potential difference represented by the indicium's associated digital signal.

6. The method of claim 4 wherein the step (e.2) comprises:
   (e.2.1) storing the digital representations in a time buffering memory, and
   (e.2.2) retrieving the stored digital representations and displaying them in analog form in an ordered pattern of indicia on a variable intensity screen such that each digital representation is represented by a uniquely positioned indicium, the intensity of each indicium being generally inversely proportional to the magnitude of the potential difference represented by the indicium's associated digital signal.

7. The method of claim 3 further comprising the step of repeating steps (a) through (e) until the number of suitably low intensity indicium are within a selected tolerance.

8. The method of claim 3 further comprising the step of repeating steps (a) through (e) until the number of suitably low intensity indicium are within a selected tolerance.

9. The method of claim 5 further comprising the step of repeating steps (a) through (e) until the number of suitably low intensity indicium are within a selected tolerance.

10. The method of claim 6 further comprising the step of repeating steps (a) through (e) until the number of suitably low intensity indicium are within a selected tolerance.

* * * * *

UNITED STATES PATENT AND TRADEMARK OFFICE
CERTIFICATE OF CORRECTION

PATENT NO. : 4,803,422

DATED : Feb. 7, 1989

INVENTOR(S) : John J. Ignatowski, Warren, Mich.

It is certified that error appears in the above-identified patent and that said Letters Patent is hereby corrected as shown below:

Title page, item [45]:

Please correct the year in the Date of Patent from "1988" to --1989--.

Signed and Sealed this

Twentieth Day of March, 1990

Attest:

JEFFREY M. SAMUELS

*Attesting Officer*  *Acting Commissioner of Patents and Trademarks*